United States Patent [19]

Coppens et al.

[11] Patent Number: 5,612,166
[45] Date of Patent: Mar. 18, 1997

[54] IMAGING ELEMENT AND METHOD FOR MAKING LITHOGRAPHIC PRINTING PLATES ACCORDING TO THE SILVER SALT DIFFUSION TRANSFER PROCESS

[75] Inventors: Paul Coppens, Turnhout; René De Keyzer, Waasmunster; Johan Loccufier, Zwijnaarde, all of Belgium

[73] Assignee: Agfa-Gevaert, N.V., Mortsel, Belgium

[21] Appl. No.: 660,004

[22] Filed: Jun. 3, 1996

[30]   Foreign Application Priority Data

Jun. 23, 1995 [EP]   European Pat. Off. ............ 95201713

[51] Int. Cl.$^6$ .............................. G03C 8/06; G03C 8/50; G03C 1/805; G03F 7/07
[52] U.S. Cl. ........................... 430/204; 430/227; 430/259
[58] Field of Search .................................. 430/204, 227, 430/259

[56]   References Cited

U.S. PATENT DOCUMENTS 5,068,165  11/1991  Coppens et al. .................. 430/204
5,273,858  12/1993  Coppens et al. .................. 430/204
5,496,679   3/1996  Hauguier et al. ................. 430/204

*Primary Examiner*—Richard L. Schilling
*Attorney, Agent, or Firm*—Breiner & Breiner

[57]   ABSTRACT

The present invention provides an imaging element comprising in the order given on a hydrophilic surface of a support (i) an image receiving layer containing physical development nuclei, (ii) a photosensitive layer containing a silver halide emulsion being in water permeable relationship with said image receiving layer and (iii) an intermediate layer between said image receiving layer and said photosensitive layer, characterized in that said intermediate layer comprises particles of an alkali insoluble non-polymeric organic compound having a melting point of at least 50° C, said particles having a number average size between 0.1 µm and 10 µm.

According to the present invention there is also provided a method for making an offset printing plate according to the silver salt diffusion transfer process by using said imaging element+.

9 Claims, No Drawings

IMAGING ELEMENT AND METHOD FOR MAKING LITHOGRAPHIC PRINTING PLATES ACCORDING TO THE SILVER SALT DIFFUSION TRANSFER PROCESS

DESCRIPTION

1. Field of the invention.

The present invention relates to an imaging element for making improved offset printing plates according to the silver salt diffusion transfer process. Furthermore the present invention relates to a method for making improved offset printing plates with said imaging element.

2. Background of the invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving layer and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB1,241,661 a support is provided in the order given with a silver halide emulsion layer and a layer containing physical development nuclei serving as the image-receiving layer. After information-wise exposure and development the imaged element is used as a printing plate without the removal of the emulsion layer. This type of printing plates has a low printing endurance, typically around 10000 copies.

According to a second type of mono-sheet DTR offset printing plate a hydrophilic support, mostly anodized aluminum, is provided in the order given with a layer of physical development nuclei and a silver halide emulsion layer. After information-wise exposure and development the imaged element is treated to remove the emulsion layer so that a support carrying a silver image is left wich is used as a printing plate. This type of printing plates has a much higher printing endurance, typically at least 25000 copies. Such type of lithographic printing plates is disclosed e.g. in U.S. Pat. No. 3,511,656, EP-A-278766, EP-A-410500 and EP-A-483415.

The process by which the printing plate is obtained should be an easy, ecological and ergonomical one. Yet, removing the emulsion layer e.g. by treating the developed imaging element with an aqueous solution, what is the most usual procedure can be a costly and cumbersome process, requiring the use of hot water and a finisher comprising large amounts of trypsin.

The use of hot water has several disadvantages. The cost of hot water is high. Moreover, hot water dissolves the proteinic binder, usually gelatin, of the emulsion layer, thus causing decomposition of said layer so that a dirty black waste water comprising silver particles and dissolved silver salts is obtained, which upon cooling may clog filters and draining pipes. Moreover, trypsin is extraordinarily expensive and is ecologically harmful.

According to U.S. Pat. No. 5,068,165 these disadvantages have been circumvented for the major part by providing between the aluminum foil and the silver halide emulsion layer a thin water-swellable intermediate layer comprising for at least 70% of its total weight at least one non-proteinic hydrophilic film-forming polymer.

However, as a consequence. the deposition of silver on the aluminum surface and the sharpness of the transferred silver image are reduced.

According to U.S. Pat. No. 5,273,858 these disadvantages have been circumvented by providing between the aluminum foil and the silver halide emulsion an intermediate layer comprising hydrophobic polymer beads prepared by polymerization of at least one ethylenically unsaturated monomer and having an average diameter not lower than 0.2 µm. However, said solution is still not completely satisfactory.

SUMMARY OF THE INVENTION

It is an object of the present invention to provide an imaging element for making offset printing plates according to the silver salt diffusion transfer process with good printing quality and ergonomical processing.

It is another object of the present invention to provide a method for making offset printing plates with said imaging element having good printing quality and ergonomical processing.

Further objects of the present invention will become clear from the description hereinafter.

According to the present invention there is provided an imaging element comprising in the order given on a hydrophilic surface of a support (i) an image receiving layer containing physical development nuclei, (ii) a photosensitive layer containing a silver halide emulsion being in water permeable relationship with said image receiving layer and (iii) an intermediate layer between said image receiving layer and said photosensitive layer, characterized in that said intermediate layer comprises particles of an alkali insoluble non-polymeric organic compound having a melting point of at least 50° C., said particles having a number average size between 0.1 µm and 10 µm.

According to the present invention there is also provided a method for making an offset printing plate according to the silver salt diffusion transfer process comprising the steps of:
(a) image-wise exposing an imaging element according to the present invention,
(b) applying an aqueous alkaline solution to the imaging element in the presence of (a) developing agent(s) and (a) silver halide solvent(s), (c) treating the imaging element to remove the layer(s) on top of said image receiving layer, thereby uncovering said silver image formed in said image receiving layer.

DETAILED DESCRIPTION OF THE INVENTION

According to the present invention it has been found that a lithographic printing plate obtained according to the DTR-process by using an imaging element comprising an intermediate layer comprising particles of an alkali insoluble non-polymeric organic compound having a melting point of at least 50° C., said particles having a number average size between 0.1 µm and 10 µm has a high resolving power and a good match between the printing plate and the print.

As alkali insoluble non-polymeric compound is considered a compound that at 20° C. has a solubility in a sodium hydroxide solution of pH 10 of less than 1 g/l preferably less than 0.1 g/l and that contains at least one carbon-carbon bound. A non-polymeric compound is a compound whereof at least half of the number fraction of the molecules has exactly the same molecular weight.

The number average size of said alkali insoluble non-polymeric compound is expressed as the number average diameter of a sphere with an equivalent volume. Said particles of said alkali insoluble non-polymeric organic compound having a melting point of at least 50° C., preferably of at least 60° C., more preferably of at least 70° C. have preferably a number average size between 0.2 µm and 5 µm, more preferably between 0.3 and 2 µm.

Said particles of alkali insoluble non-polymeric compound can have any form, but are preferably spherical (beads).

Said particles having a number average diameter between 0.1 and 10 µm are preferably prepared by making a dispersion of said alkali insoluble non-polymeric compounds. A dispersion of said alkali insoluble non-polymeric compounds may be obtained by the folowing steps.

In a first step a predispersion having particles with sizes in the range of 0.2 µm to 20 µm is obtained by stirring said alkali insoluble non-polymeric compound, preferably in an amount ranging from 8 g/l to 300 g/l, more preferably from 30 g/l to 200 g/l in a solution of water or of water with an aqueous miscible silvent e.g. ethanol in the presence of a surfactant in an amount ranging from 0.10 g/l to 25 g/l, more preferably from 0.30 g/l to 7.5 g/l with a high shear mixer e.g. ULTRA TURRAX, KOTTHOFF MISCHSIRENE or DISSOLVER . The duration of said stirring is not so critical but should be long enough to get an homogenuous predispersion. In practice a duration ranging from 120 s to 1800 s, more preferably from 360 s to 1200 s is applied. The temperature of the stirring is not critical but is for practical reasons preferably at least 5° C. lower than the melting point of the alkali insoluble non-polymeric compound , more preferably said temperature lies between 20° C. and 35° C.

If particles with a number average size of smaller than 5 µm are wanted said predispersion is milled in a second step till the desired size is obtained. Suitable mills are e.g. horizontal pearl mills f.i. DYNOMILL and COBALL-MILL, ball mills, sand mills , vertical mills etc. The temperature of the milling is not critical but is for practical reasons preferably at least 5° C. lower than the melting point of said alkali insoluble non-polymeric compound, more preferably said temperature lies between 20° C. and 35° C. The duration of the milling is determined by the technical features of the mill but is obvious for one skilled in the art.

In practice said duration may range from 120 s to 3600 s, preferably from 300 s to 2400 s.

Preferably said alkali insoluble non-polymeric compound are present in said intermediate layer in an amount of at least 0.1 g/m$^2$, more preferably in an amount of at least 0.15 g/m$^2$. The upper limit is not so important but is preferably not more than 3.0 g/m$^2$. It is of course clear that said alkali insoluble nonpolymeric compounds can be used in admixture in said intermediate layer.

Said intermediate layer can further comprise hydrophobic polymer particles prepared by polymerization of at least one ethylenically unsaturated monomer in an amount up to 70% by weight of said intermediate layer. Said intermediate layer can also comprise an aqueous dispersion of alkali-soluble hydrophobic polymer particles, having a number average particle size not lower than 0.2 µm. The amount of said aqueous dispersion of alkali-soluble hydrophobic polymer particles present in said intermediate layer may be up to 10 by weight calculated on the total weight of said layer.

Non-proteinic hydrophilic film-forming polymers may be present in the intermediate layer in an amount of e.g. up to 20% by weight of the total weight of said layer. Suitable non-proteinic hydrophilic film-forming polymers are e.g. polyvinyl alcohol, polyvinyl pyrrolidone, polyethylene oxide, partly hydrolyzed polyvinyl acetate, sulphonated polystyrene, hydroxyethyl cellulose, carboxymethyl cellulose, cellulose acetate hydrogen phthalate, dextran, dextrins or derivatives thereof, starch, gum arabic, and alginic acid derivatives such as salts or esters thereof. It is also possible to use mixtures of two or more different non-proteinic hydrophilic film-forming polymers.

The intermediate layer may further comprises various ingredients such as surfactants, antistatic agents, coloring agents,matting agents, etc.

Preferably the intermediate layer comprises at least 30% by weight, more preferably at least 50% by weight, still more preferably at least 75% by weight, most preferably at least 90% by weight of said particles of said alkali insoluble non-polymeric compound having a number average size between 0.1 µm and 10 µm.

Said hydrophilic surface of a support can be a hardened hydrophilic layer, containing a hydrophilic synthetic homopolymer or copolymer and a hardening agent coated on a flexible support. Preferred hydrophilic layers are layers of polyvinyl alcohol hardened with a tetraalkyl orthosilicate and preferably containing SiO$_2$ and/or TiO$_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. Nos. 3,971,660, 4,284,705, EP-A 405,016 and EP-A 450,199 which therefor are incorporated herein by reference.

Said hydrophilic surface of a support is preferably a hydrophilic metallic support e.g. an aluminum support.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally post-treating of the foil. Preferably the aluminum foil has a roughness with a CLA value between 0.2 and 1.5 µm, an anodization layer with a thickness between 0.4 and 2.0 µm and is post-treated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc.

Electrochemical graining in connection with the present invention can be performed using single-phase and three-phase alternating current. The voltage applied to the aluminum plate is preferably 10–35 V. A current density of 3–150 $Amp/dm^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C., more preferably at least 40° C. and most preferably at least 50° C.

Suitable acids for use in the aqueous etch solution are preferably inorganic acids and most preferably strong acids. The total amount of acid in the aqueous etch solution is preferably at least 150g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 $A/dm^2$ and a voltage within the range 1–100 V to obtain an anodized film weight of 1–8 $g/m^2$ $Al_2O_3.H_2O$. The anodized aluminum foil may subsequently be rinsed with demineralised water within a temperature range of 10°–80° C.

After the anodizing step a posttreatment such as sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24 ste jaargang/januari 1980. under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the hydrophilic surface of a support as described above the hydrophilic surface may be immediately coated with a solution containing the physical development nuclei or may be coated with said solution at a later stage.

The image receiving layer for use in accordance with the present invention can be free of hydrophilic binder but preferably comprises amounts up to 80% by weight of the total weight of said layer of a hydrophilic colloid e.g. polyvinyl alcohol to improve the hydrophilicity of the layer. Preferably, the pH of the coating solution of said image receiving layer is between 7 and 11, more preferably between 8.5 and 10.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546.598. Especially preferred development nuclei in connection with the present invention are palladium sulphide nuclei having an average diameter less than 6 nm and wherein the number of nuclei having a diameter larger than 4.5 nm is less than 15% of the total number of nuclei contained in said image receiving layer.

To promote the image sharpness the hydrophilic surface of a support can be provided with a very thin antihalation coating of a dye or pigment or the image receiving layer may incorporate at least one antihalation dye or pigment.

The photosensitive layer used in accordance with the present invention may be any silver halide emulsion layer comprising a hydrophilic colloid binder, at least one of the silver halide emulsions being photosensitive.

The photographic silver halide emulsion(s) for coating silver halide emulsion layers in accordance with the present invention can be prepared from soluble silver salts and soluble halides according to different methods as described e.g. by P. Glafkides in "Chimie et Physique Photographique", Paul Montel, Paris (1967), by G.F. Duffin in "Photographic Emulsion Chemistry", The Focal Press, London (1966), and by V.L. Zelikman et al. in "Making and Coating Photographic Emulsion", The Focal Press, London (1966).

According to the present invention the emulsion or emulsions preferably consist principally or totally of silver chloride. A fraction of silver bromide may be present ranging from 1 mole % to 40 mole %. The emulsions having more than 2 mole % of silver bromide preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 µm, preferably from 0.25 to 0.45 µm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R.KOSLOWSKY, Z. Wiss. Photogr. Photophys. Photochem. 46, 65-72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

For instance, direct-positive silver halide emulsions that mainly form an internal image as described in e.g. EP-A 365,926 and U.S. Pat. No. 3,062,651 may be employed. Alternatively, prefogged direct-positive silver halide emulsions with internal or, more preferably, with external electron traps as disclosed in EP-A 94201899.5 and EP-A 481,562 are also suitable for use in connection with the present invention.

The silver halide emulsions of the DTR-element can be spectrally sensitized according to the spectral emission of the exposure source for which the DTR element is designed.

Suitable sensitizing dyes for the visible spectral region include methine dyes such as those described by F.M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2-27 (1952). Other suitable emulsion stabilizers are i.a. heterocyclic mercapto compounds, especially substituted or unsubstituted 1-phenyl-5-mercapto-tetrazole, particularly 1-phenyl-5-mercapto-tetrazoles substituted by the amido group $-NR_1-CO-R_2$ or $-NR_1-SO_2-R_2$ wherein $R_1$ represents hydrogen or $C_1-C_4$ alkyl and $R_2$ represents a hydrocarbon group selected from the group consisting of $C_{1-C8}$ alkyl, aryl, and alkenyl wherein said hydrocarbon group is substituted by a $-COOM$ group or a $-SO_3M$ group with M representing hydrogen, a metal cation or an ammonium group.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPa.s at a shearing rate of 1000 $s^{-1}$ combined with a gelatin of a higher viscosity. The weight ratio of said low viscosity gelatin versus the gelatin of a higher viscosity is preferably>0.5.

Preferably the gelatin layer(s) is(are) substantially unhardened. Substantially unhardened means that when such gelatin layer is coated on a subbed polyethylene terephtalate film base at a dry thickness of 1.2 g/m², dried for 3 days at 57C° and 35% R.H. and dipped in water of 30C°, said gelatin layer is dissolved for more than 95% by weight within 5 minutes.

The silver halide emulsions may contain pH controlling ingredients. Preferably at least one gelatin containing layer is coated at a pH value not below the iso-electric point of the gelatin to avoid interactions between said gelatin containing coated layer and the mentioned intermediate layer. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

A supplemental intermediate layer, which may be present between said silver halide emulsion containing layer and said intermediate layer comprising particles of an alkali insoluble non-polymeric compound having a number average size between 0.1 µm and 10 µm may incorporate one or more ingredients such as i.a. antihalation dyes or pigments, developing agents, silver halide solvents, base precursors, and anticorrosion substances.

The silver halide emulsion layer and optional other layers may be coated to the aluminum support according to the present invention provided with an image receiving layer using commonly applied coating techniques as silde hopper coating or curtain coating. Alternatively these layers may be first coated to a temporary support e.g. a polyester film and subsequently laminated to the aluminum support as disclosed in EP-A-410500.

When the imaging element is prepared by laminating a layer packet comprising a photosensitive layer onto the image receiving layer the intermediate layer(s) are provided on the photosensitive layer(s), the intermediate layer comprising particles of an alkali insoluble non-polymeric compound having a number average size between 0.1µm and 10 µm being the upper layer.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

According to the present invention the development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of (a) developing agent(s), and (a) silver halide solvent(s). The developing agent(s) and/or the silver halide solvent(s) can be incorporated in the aqueous alkaline solution and/or in the imaging element.

Preferably a silver halide solvent in the aqueous alkaline solution is used in an amount between 0.05% by weight and 5% by weight and more preferably between 0.5% by weight and 2% by weight. The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

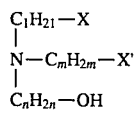

wherein X and X' independently represent hydrogen, a hydroxyl group or an amino group, l and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

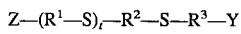

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10. Examples of thioether compounds corresponding to the above formula are disclosed in e.g. U.S. Pat. No. 4.960.683 and EP-A 554,585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

Preferred amounts of the hydroquinone-type developing agents are in the range of 0.05 mole to 0.40 mole per litre and preferred amounts of secondary developing agent(s) in the range of $1.8 \times 10^{-3}$ to $2.0 \times 10^{-1}$ mole per litre.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc.. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 3-mercapto-5-alkyl 1,2,4-triazoles, 2-mercapto-5-heptyl-oxa-3,4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per litre and preferably in admixture with 1-phenyl-5-mercaptotetrazole, the latter compound may be used in amounts of e.g. 50 mg to 1.2 g per litre of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary with a so-called stabilization liquid, which actually is an acidic stop-bath having a pH preferably in the range from 5 to 7.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image on the hydrophilic surface of a support an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is at least 5° C. below the melting point of said alkali insoluble nonpolymeric organic compound and is preferably between 35° C. and 45° C.

The imaged surface of the hydrophilic surface of a support can be subjected to a chemical treatment that increases the hydrophilicity of the non-silver image parts and the oleophilicity of the silver image This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

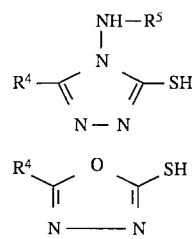

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is (are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkey red oil may be added.

Furthermore (a) surface-active compound(s) is preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. No. 4.563.410 is a composition comprising a solution of a mercaptotriazole in a solution of polyethylene oxide with a molecular weight of 4,000. Further suitable finishers have been described in i.a. U.S. Pat. No. 4.062.682.

At the moment the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

The following example illustrates the present invention without however, limiting it thereto. All parts, percentages and ratios are by weight unless otherwise indicated.

EXAMPLE 1

A 0.30 mm thick aluminium foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0,6 μm. The aluminium plate was then desmutted with an aqueous solution containing 30% of sulfuric acid at 60° C. for 120 seconds. The foil was subsequently subjected to anodic oxidation in an aqueous solution containing 200 g/l of sulfuric acid at a temperature of 45° C., a voltage of about 10 V and a current density of 150 A/m$^2$ for about 300 s to form an anodic oxidation film of 3.00 g/m$^2$ of Al$_2$O$_3$, then washed with demineralised water, posttreated with a solution containing 20 g/l of sodium bicarbonate at 40 ° C. for 30 s, subsequently rinsed with demineralized water of 20° C. during 120 s and finally dried.

An imaging element I was obtained by coating the grained, anodized and sealed aluminum support with a silver-receptive stratum containing 0.7 mg/m$^2$ PdS as physical development nuclei.

An intermediate layer was then provided on the dry silver-receptive stratum from an aqueous composition in such a way that the resulting dried layer had a weight of 0.5 g of polymethyl methacrylate beads per m$^2$, said composition comprising:

| | |
|---|---|
| a 20% dispersion of polymethyl methacrylate beads in a mixture of equal volumes of water and ethanol having an average diameter of 0.8 μm | 50 ml |
| Helioechtpapierrot BL (trade mark for a dye sold by BAYER AG, D-5090 Leverkusen, West-Germany) | 2.5 g |
| GEBO (trade mark for a surfactant sold by Chemische Fabrik Chem-Y, Gmbh, Germany) | 1.25 g |
| TERGO (trade mark for a surfactant sold by Chemische Fabrik Chem-Y, Gmbh, Germany) | 0.2 g |
| Saponine | 3.5 g |
| demineralized water | 300 ml |
| (pH-value: 5.6) | |

Finally a substantially unhardened photosensitive negative-working cadmium-free gelatin silver chlorobromoiodide emulsion layer (97.98/2/0.02 mol %) containing 2.2 mmole/mole AgX of 1-(3-(2-sulphobenzamido)) phenyl-5-mercapto-tetrazole was coated on the intermediate layer, the silver halide being provided in an amount corresponding to 2.40 g of silver nitrate per m$^2$ and the gelatin content of the emulsion layer being 1.58 g/m$^2$, consisting of 0.7 g/m$^2$ of a gelatin with a viscosity of 21 mPa.s and the remainder of a gelatin with a viscosity of 14 mPa.s Imaging element II was prepared in an identical way except that in the intermediate layer composition the 20% dispersion of polymethyl methacrylate beads was replaced by 200 ml of dispersion Disp 1 and only 150 ml of demineralized water was used. Said dispersion was prepared as follows:

To 400 ml of water were added under stirring 50 g of triphenylmethanol (melting point 162° C.) and 0.5 g of ANTAROX CO 630 (a non-ionic surfactant of GAF, USA) and the obtained mixture stirred for 300 s more with a high shear mixer KOTTHOFF MISCHSIRENE at 720 rpm. To this mixture was added 400 ml of water and this mixture was further stirred as described above for 300 s more. Finally there was added 200 ml more of water under stirring to obtain a predispersion 1.

Said predispersion was then milled by 6 passages in a DYNOMILL KDL 0.6 1 with ZrO$_2$ pearls of 1–1.6 mm and a perimeter speed of 16 m/s at a flow rate of 1.6 ml/s to yield the dispersion Disp 1. The particles of said dispersion have a number average size between 0.3 and 1 μm as evaluated on a light microscope.

Imaging elements III and IV were prepared in an identical way as imaging element II except that the resulting Disp 1 was provided on the dry silver-receptive stratum in such a way that the resulting dried layer had in imaging element III a weight of 0.38 g of triphenylmethanol beads per m$^2$ and in imaging element IV a weight of 0.19 g of triphenylmethanol beads per m$^2$.

Imaging element V was prepared in an identical way as imaging element IV except that the nonionc surfactant in the predispersion was replaced by cetyltrimethyl ammonium bromide.

Those 5 imaging elements were identically exposed through a step wedge in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |

-continued

| | |
|---|---|
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layers.

To remove the developed silver halide emulsion layer and the intermediate layer from the aluminum foils the developed monosheet DTR materials were rinsed for 4 s with a water jet at 40° C. The washwater is collected in a washwater tank and used again for providing the water to the water jet. Next, the imaged surface of the aluminum foils was treated with a finisher to enhance the water-receptivity of the non-image areas and to make the image areas oleophilic ink-receptive. The finisher had the following composition:

| | |
|---|---|
| Gebo (trade mark for a surfactant sold by Chemische Fabrik Chem-Y, Gmbh, Germany) | 250 mg |
| polyethylene glycol 3000 | 100 ml |
| potassium nitrate | 12.5 g |
| citric acid | 20.0 g |
| 2-mercapto-5-heptyl-oxa-3,4-diazole | 2.0 g |
| $NaH_2PO_4.2H_2O$ | 20.0 g |
| 5-bromo-5-nitro-1,3-dioxane | 200 mg |
| sodium hydroxyde | 13.0 g |
| water to make | 1000 ml |
| pH (20° C.) = 5.9 | |

The printing plates thus prepared were mounted on the same offset printing machine (HEIDELBERG GTO-46) and were used for printing under identical conditions. Commercial AQUA TAME 7035E, marketed by Anchor/Lithemko Inc., Florida, was used at a 5% concentration in an aqueous solution containing 10% isopropanol as dampening solution and K+E 125, marketed by Kast+Ehinger, A.G., Germany, as ink. A compressible rubber blanket was used.

The results are given in the following Table 1.

TABLE 1

| Material | Match[a] | Resolving Power[b] |
|---|---|---|
| I | 9.5 μm | 22.0 μm |
| II | 2.25 μm | 19.0 μm |
| III | 3.50 μm | 16.5 μm |
| IV | 3.75 μm | 17 μm |
| V | 3.25 μm | 19.0 μm |

[a]Match: difference between the smallest observable dot on the printing plate and on the copy (in μm) (number average of 6 experiments).
[b]Resolving power: dimension of the point where the positive point and the negative point have the same value.

It is clear from the results in table 1 that the printing plates obtained from the imaging elements comprising an intermediate layer comprising particles of triphenylmethanol beads having a number average diameter between 0.3 and 1 μm (imaging elements II, III, IV and V according to the invention) gave a better match between plate and print and a better resolving power than a printing plate obtained from an imaging elements comprising an intermediate layer comprising polymethylmethacrylate beads having a number average diameter of 0.8 μm (comparison elements I).

We claim:

1. An imaging element comprising in the order given on a hydrophilic surface of a support (i) an image receiving layer containing physical development nuclei, (ii) a photosensitive layer containing a silver halide emulsion being in water permeable relationship with said image receiving layer and (iii) an intermediate layer between said image receiving layer and said photosensitive layer, characterized in that said intermediate layer comprises particles of an alkali insoluble non-polymeric organic compound having a melting point of at least 50° C., said particles having a number average size between 0.1 μm and 10 μm.

2. An imaging element according to claim 1, wherein said alkali insoluble non-polymeric organic compound has a melting point of at least 60° C.

3. An imaging element according to claim 2, wherein said alkali insoluble non-polymeric organic compound has a melting point of at least 70° C.

4. An imaging element according to claim 1, wherein said particles of an alkali insoluble non-polymeric organic compound having a melting point of at least 50° C. have a number average size between 0.2 μm and 5 μm.

5. An imaging element according to claim 4, wherein said particles of an alkali insoluble non-polymeric organic compound having a melting point of at least 50° C. have a number average size between 0.3 μm and 2 μm.

6. An imaging element according to claim 1, wherein said particles are spherical.

7. An imaging element according to claim 1, wherein said particles of an alkali insoluble non-polymeric organic compound having a melting point of at least 50° C., said particles having a number average size between 0.1 μm and 10 μm are present in said intermediate layer in an amount of at least 0.1 g/m².

8. An imaging element according to claim 7, wherein said particles of an alkali insoluble non-polymeric organic compound having a melting point of at least 50° C., said particles having a number average size between 0.1 μm and 10 μm are present in said intermediate layer in an amount of at least 0.15 g/m².

9. A method for making an offset printing plate according to the silver salt diffusion transfer process comprising the steps of:

(a) image-wise exposing an imaging element according to claim 1, (b) applying an aqueous alkaline solution to the imaging element in the presence of (a) developing agent(s) and (a) silver halide solvent(s), (c) treating the imaging element to remove the layer(s) on top of said image receiving layer, thereby uncovering said silver image formed in said image receiving layer.

* * * * *